US 7,265,398 B1

(12) United States Patent
Yu

(10) Patent No.: US 7,265,398 B1
(45) Date of Patent: Sep. 4, 2007

(54) METHOD AND STRUCTURE FOR COMPOSITE TRENCH FILL

(75) Inventor: Ho-Yuan Yu, Saratoga, CA (US)

(73) Assignee: Qspeed Semiconductor Inc., Santa Clara, CA (US)

( * ) Notice: Subject to any disclaimer, the term of this patent is extended or adjusted under 35 U.S.C. 154(b) by 27 days.

(21) Appl. No.: 10/816,980

(22) Filed: Apr. 2, 2004

Related U.S. Application Data

(62) Division of application No. 10/439,558, filed on May 15, 2003, now Pat. No. 6,887,768.

(51) Int. Cl.
*H01L 29/80* (2006.01)
*H01L 31/112* (2006.01)

(52) U.S. Cl. .............. 257/263; 257/266; 257/E21.546

(58) Field of Classification Search ............ 438/426, 438/429, 430, 435, 437; 257/260, 263, 264, 257/265, 266, 287, 301, 302, 303, 304, E21.546
See application file for complete search history.

(56) References Cited

U.S. PATENT DOCUMENTS

| | | | | |
|---|---|---|---|---|
| 4,791,462 A | * | 12/1988 | Blanchard et al. | 257/260 |
| 4,835,586 A | * | 5/1989 | Cogan et al. | 257/260 |
| 5,602,405 A | * | 2/1997 | Terasawa | 257/136 |
| 5,753,938 A | * | 5/1998 | Thapar et al. | 257/77 |
| 5,847,417 A | * | 12/1998 | Terasaw | 257/135 |
| 5,861,643 A | * | 1/1999 | Chen et al. | 257/256 |
| 5,883,406 A | * | 3/1999 | Nishizawa | 257/264 |
| 6,566,227 B2 | * | 5/2003 | Wensley et al. | 438/430 |
| 6,576,516 B1 | * | 6/2003 | Blanchard | 438/268 |
| 6,707,095 B1 | * | 3/2004 | Chidambarrao et al. | 257/302 |
| 6,762,447 B1 | * | 7/2004 | Mandelman et al. | 257/301 |
| 6,818,940 B2 | * | 11/2004 | Matsuda | 257/302 |
| 6,855,981 B2 | * | 2/2005 | Kumar et al. | 257/328 |
| 2002/0024082 A1 | * | 2/2002 | Tsunashima et al. | 257/301 |
| 2002/0036318 A1 | * | 3/2002 | Thapar | 257/320 |
| 2002/0066917 A1 | * | 6/2002 | Jaiprakash et al. | 257/301 |
| 2002/0125521 A1 | * | 9/2002 | Schrems | 257/301 |
| 2003/0013259 A1 | * | 1/2003 | Chidambarrao et al. | 438/301 |
| 2003/0025140 A1 | * | 2/2003 | Kusters et al. | 257/301 |
| 2003/0047767 A1 | * | 3/2003 | Luetzen et al. | 257/301 |
| 2003/0062562 A1 | * | 4/2003 | Goebel et al. | 257/302 |
| 2003/0082876 A1 | * | 5/2003 | Mandelman et al. | 438/243 |
| 2003/0168690 A1 | * | 9/2003 | Karcher et al. | 257/301 |

(Continued)

OTHER PUBLICATIONS

H. Ogiwara, M. Hayakawa, T. Nishimura and M. Nakaoka; "High-Frequency Induction Heating Inverter With Multi-Resonant Mode Using Newly Developed Normally-Off Type Static Induction Transistors"; Department of Electrical Engineering, Oita University, Japan; Department of Electrical Engineering, Kobe University, Japan; pp.1017-1023.

(Continued)

*Primary Examiner*—Ngan Ngo
(74) *Attorney, Agent, or Firm*—Morgan, Lewis & Bockius LLP

(57) ABSTRACT

A method and structure for a composite trench fill for silicon electronic devices. On a planar silicon substrate having a first deposited layer of oxide and a second deposited layer of polysilicon, a trench is etched. Deposition and etch processes using a combination of oxide and polysilicon are used to fabricate a composite trench fill. The trench bottom and a lower portion of the walls are covered with oxide. The remaining portion of the trench volume is filled with polysilicon. The method may be used for junction field effect transistors (JFETs) and metal oxide semiconductor field effect transistors (MOSFETs).

20 Claims, 11 Drawing Sheets

U.S. PATENT DOCUMENTS

| | | | |
|---|---|---|---|
| 2003/0201480 A1* | 10/2003 | Chidambarrao et al. | 257/301 |
| 2004/0000683 A1* | 1/2004 | JaiPrakash et al. | 257/301 |
| 2004/0007728 A1* | 1/2004 | Chang et al. | 257/301 |
| 2004/0036100 A1* | 2/2004 | Divakaruni et al. | 257/301 |
| 2004/0084708 A1* | 5/2004 | Seitz et al. | 257/302 |
| 2004/0164338 A1* | 8/2004 | Koyama | 257/301 |
| 2005/0167720 A1* | 8/2005 | Furuhata et al. | 257/301 |

OTHER PUBLICATIONS

J. Baliga; "Highvoltage Junction-Gate Field Effect Transistor Wth Recessed Gates"; IEEE Transactions on Electron Devices; vol. ED-29; No. 10; Oct. 1982.

J. M. C. Stork et al.; "Small Geometry Depleted Base Bipolar Transistors (BSIT)- VLSI Devices?"; IEEE Transactions on Electron Devices; vol. ED-28; No. 11; Nov. 1981.

Nishizawa et al.; "Analysis of Static Characteristics of A Bipolar Mode Sit (BSIT)"; IEEE Transactions on Electron Devices; vol. ED-29; No. 11; Aug. 1982.

Caruso et al.; "Performance Analysis of A Bipolar Mode Fet (BMFET) With Normally Off Characteristics"; IEEE Transactions on Power Electronics; vol. 3, No. 2; Apr. 1988.

Nishizawa et al.; "Fieldeffect Transistor Versus Analog Transistor (Static Induction Transistor)"; IEEE Transactions on Electron Devices; vol. ED-24; No. 4; Apr. 1975.

* cited by examiner

METHOD AND STRUCTURE FOR COMPOSITE TRENCH FILL

This is a divisional of application Ser. No. 10/439,558 filed on May 15, 2003, now U.S. Pat. No. 6,887,768.

FIELD OF THE INVENTION

Embodiments of the present invention relate to the field of silicon electronic devices. In particular, embodiments of the present invention relate to a trench fill method and structure.

BACKGROUND ART

Junction field effect transistors (JFETs) are majority carrier devices that conduct current through a channel that is controlled by the application of a voltage to a p-n junction. JFETs may be constructed as p-channel or n-channel and may be operated as enhancement mode devices or depletion mode devices.

The most common JFET type is the depletion mode type. The depletion mode device is a normally "on" device that is turned off by reverse biasing the p-n junction so that pinch-off occurs in the conduction channel. P-channel depletion mode devices are turned off by the application of a positive voltage between the gate and source (positive $V_{gs}$), whereas n-channel depletion mode devices are turned off by the application of a negative voltage between the gate and source (negative $V_{gs}$). Since the junction of a depletion mode JFET is reverse biased in normal operation, the input voltage $V_{gs}$ can be relatively high. However, the supply voltage between the drain and source ($V_{ds}$) is usually relatively low when the device is switched on.

Enhancement mode, or normally "off" JFETs are characterized by a channel that is sufficiently narrow such that a depletion region at zero applied voltage extends across the entire width of the channel. Application of a forward bias reduces the width of the depletion region in the channel, thereby creating a conduction path in the channel. P-channel enhancement mode JFETs are turned on by the application of a negative $V_{gs}$, and n-channel enhancement mode JFETs are turned on by the application of a positive $V_{gs}$. The input voltage of an enhancement mode JFET is limited by the forward breakdown voltage of the p-n junction.

Historically, high voltage applications for transistors have relied chiefly on bipolar junction transistors (BJTs), insulated gate bipolar transistors (IGBTs), and metal oxide semiconductor field effect transistors (MOSFETs). IGBTs and MOSFETs have the disadvantage of being susceptible to gate damage due to static discharge, and BJTs are susceptible to thermal runaway. JFETs do not have these disadvantages. JFETs share the transconductance/temperature behavior of MOSFETs, but they do not rely on an insulated gate.

In the fabrication of silicon electronic devices such as JFETs and MOSFETs, trenches may be etched that require a subsequent fill with a dielectric material. Silicon dioxide is commonly used for trench fill, but there are some disadvantages. As smaller critical dimensions are adopted for the fabrication of silicon electronic devices, thinner layers and finer registration are required, and devices are less tolerant of defects.

With typical oxide deposition processes, voids occasionally form in the region of a filled trench. These voids may form as a result of trench geometry or the characteristics of the oxide deposition process.

Another problem with conventional oxide fills is the difficulty in avoiding the unwanted removal of oxide during subsequent etchback. Unwanted material removal may be the result of over-etching in the vertical dimension or may result from poor lateral registration during an etch step. Shallow trenches are particularly susceptible, since a given amount of over-etching will constitute a greater fraction of the fill. The problem of over-etching of an oxide trench fill may be compounded by a subsequent metal deposition step, resulting in a substitution of metal for a portion of the dielectric oxide fill.

Thus, a need exists for a trench fill method that is capable of reducing the formation of voids in the vicinity of the trench. There is also a need for a trench fill method that protects against oxide over-etching, particularly for shallow trenches.

SUMMARY OF INVENTION

A method and structure for a composite trench fill for silicon electronic devices is disclosed. On a planar silicon substrate having a first deposited layer of oxide and a second deposited layer of polysilicon, a trench is etched. Deposition and etch processes using a combination of oxide and polysilicon are used to fabricate a composite trench fill. The trench bottom and a lower portion of the walls are covered with oxide. The remaining portion of the trench volume is filled with polysilicon. The method may be used for junction field effect transistors (JFETs) and metal oxide semiconductor field effect transistors (MOSFETs).

In an embodiment of the present invention, a planar silicon substrate is prepared by forming a first oxide layer on the surface of the substrate and the subsequent formation of a first polysilicon layer on the first oxide layer. A trench is then etched in the prepared substrate. A second oxide layer is then formed on the substrate and trench surfaces. A second polysilicon layer is deposited over the second oxide layer and etched back so that a polysilicon fill that is approximately level with the surface of the substrate remains within the trench. The second oxide layer is then etched back to produce a gap between the polysilicon fill and the substrate. Finally, a third polysilicon layer is deposited and etched back to fill the gap.

DESCRIPTION OF THE PREFERRED EMBODIMENTS

In the following detailed description of the present invention, a method and structure for a composite trench, numerous specific details are set forth in order to provide a thorough understanding of the present invention. However, it will be obvious to one skilled in the art that the present invention may be practiced without these specific details. In other instances well known methods involving deposition and etch, photolithography, etc., and well known structures such as ohmic contacts and barrier metallization, etc., have not been described in detail so as not to unnecessarily obscure aspects of the present invention.

U.S. Pat. No. 6,251,716 entitled "JFET Structure and Manufacture Method for Low On-Resistance and Low Voltage Application," issued Jun. 26, 2001, and assigned to the assignee of the present invention, is hereby incorporated herein by reference.

Figure 1A:
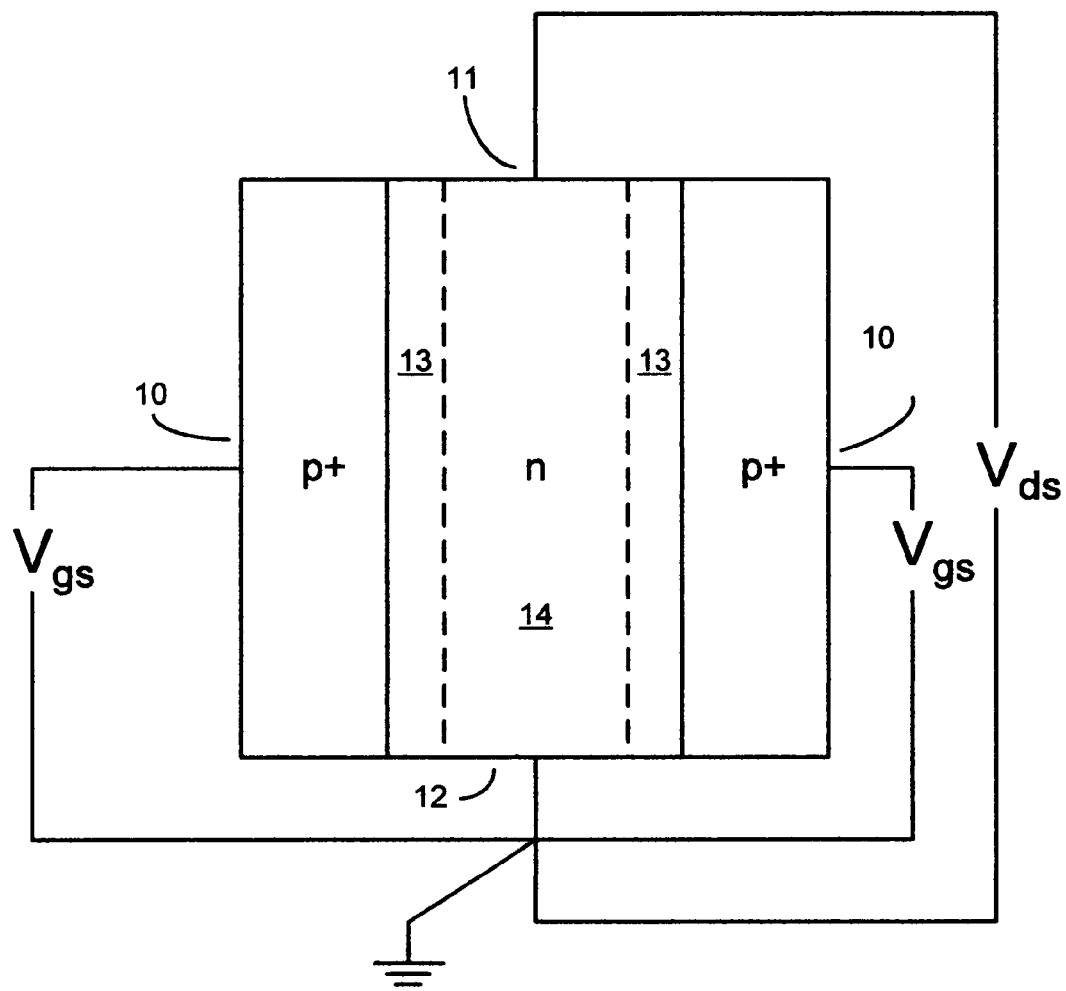
FIG. 1A shows a general schematic for an n-channel depletion mode junction field effect transistor (JFET).

FIG. 1A shows a general schematic for an n-channel depletion mode JFET with $V_{gs}=V_{ds}=0$. The JFET has two opposed gate regions 10, a drain 11 and source 12. The drain 11 and source 12 are located in the n-doped region of the device and the gates 10 are p-doped. Two p-n junctions are present in the device, each having an associated depletion region 13. A conductive channel region 14 is shown between the two depletion regions 13 associated with the p-n junctions. In operation, the voltage variable width of the depletion regions 13 is used to control the effective cross-sectional area the of conductive channel region 14. The application of a voltage $V_{gs}$ between the gates 10 and source 12 will cause the conductive channel region to vary in width, thereby controlling the resistance between the drain 11 and the source 12. A reverse bias, (e.g., a negative $V_{gs}$), will cause the depletion regions to expand, and at a sufficiently negative value cause the conductive channel to "pinch off," thereby turning off the device.

The width of the depletion regions 13 and the conductive channel region 14 are determined by the width of the n-doped region and the dopant levels in the n-doped and p-doped regions. If the device shown in FIG. 1A were constructed with a narrow n-doped region, such that the two depletion regions merged into a single continuous depletion region and the conductive channel region 14 had zero width, the result would be the device shown in FIG. 1B.

Figure 1B:
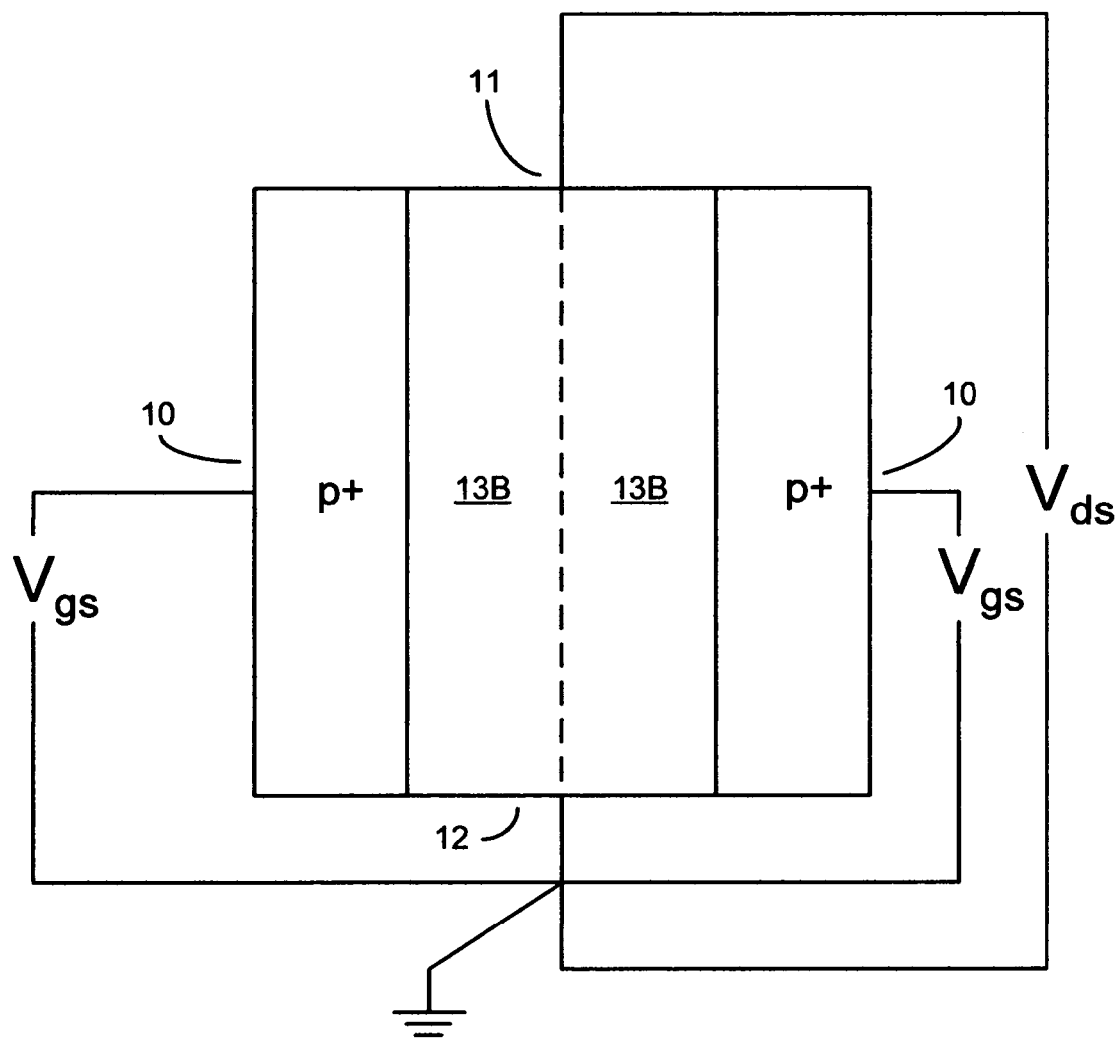
FIG. 1B shows a general schematic for an n-channel enhancement mode junction field effect transistor (JFET).

FIG. 1B shows a general schematic of an n-channel enhancement mode JFET with $V_{gs}=V_{ds}=0$. The enhancement mode device is normally "off" since the conductive channel width is zero due to the extent of the two depletion regions 13B. The application of a sufficient forward bias (e.g. positive $V_{gs}$) to the device of FIG. 1B will cause the depletion regions 13B to contract, thereby opening a conductive channel.

Although the depletion mode and enhancement mode devices shown schematically in FIG. 1A and FIG. 1B are n-channel devices, depletion mode and enhancement mode devices could be constructed with a reversed doping scheme to provide p-channel devices.

Figure 2A:
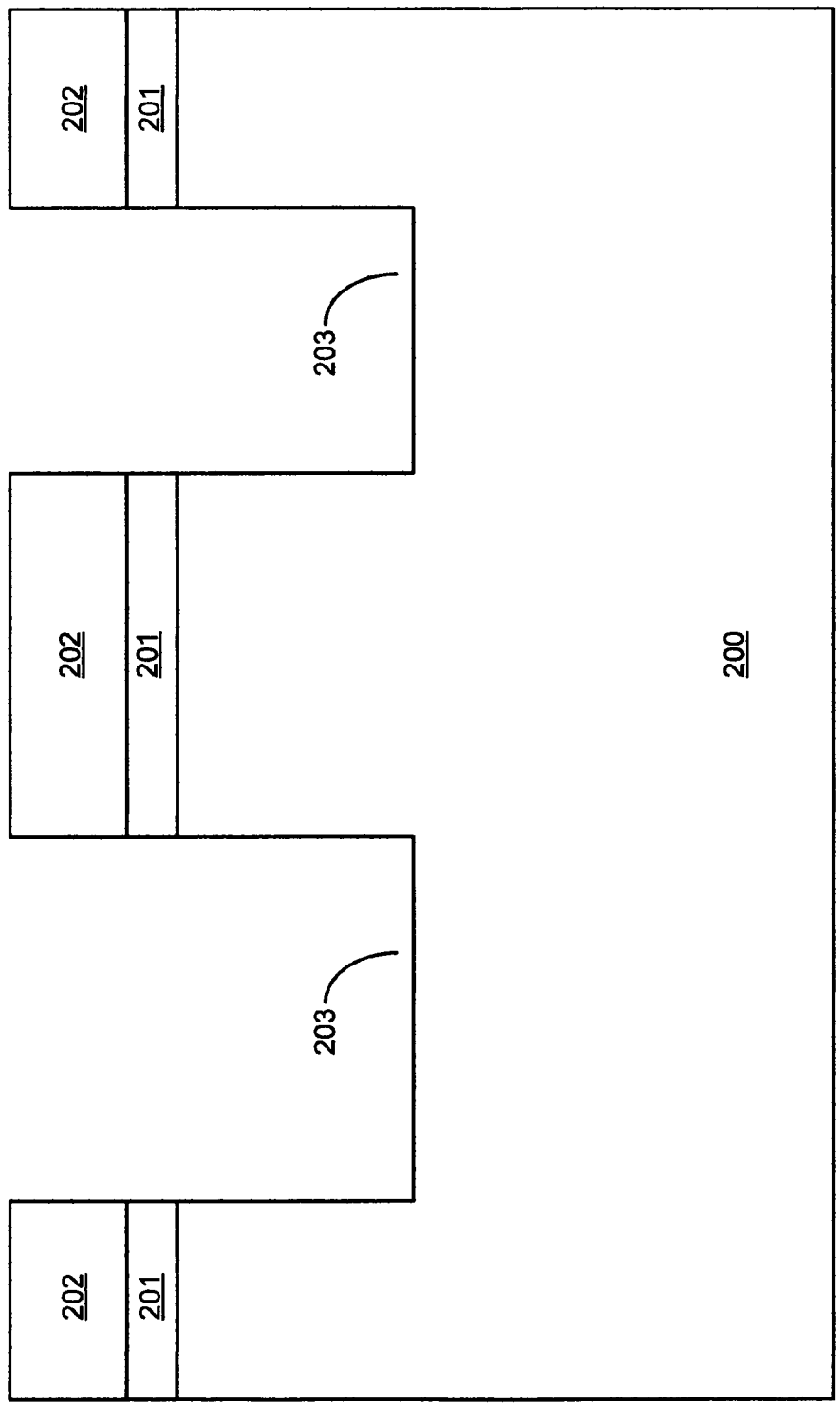
FIG. 2A shows a cross-section of a planar silicon substrate prepared for a trench fill in accordance with an embodiment of the present claimed invention.

FIG. 2A shows a cross-section of a planar silicon substrate 200 prepared for a composite trench fill in accordance with an embodiment of the present claimed invention. The substrate 200 comprises an oxide layer 201 (e.g. thermally grown or deposited $SiO_2$), and a first layer of deposited polysilicon 202. The oxide layer 201 and polysilicon layer 202 are preferably deposited prior to etching of the trenches 203. The thickness of the oxide coating 201 is preferably 100 angstroms to 5000 angstroms, and the thickness of the polysilicon layer 202 is preferably 1000 angstroms to 3000 angstroms.

Figure 2B:
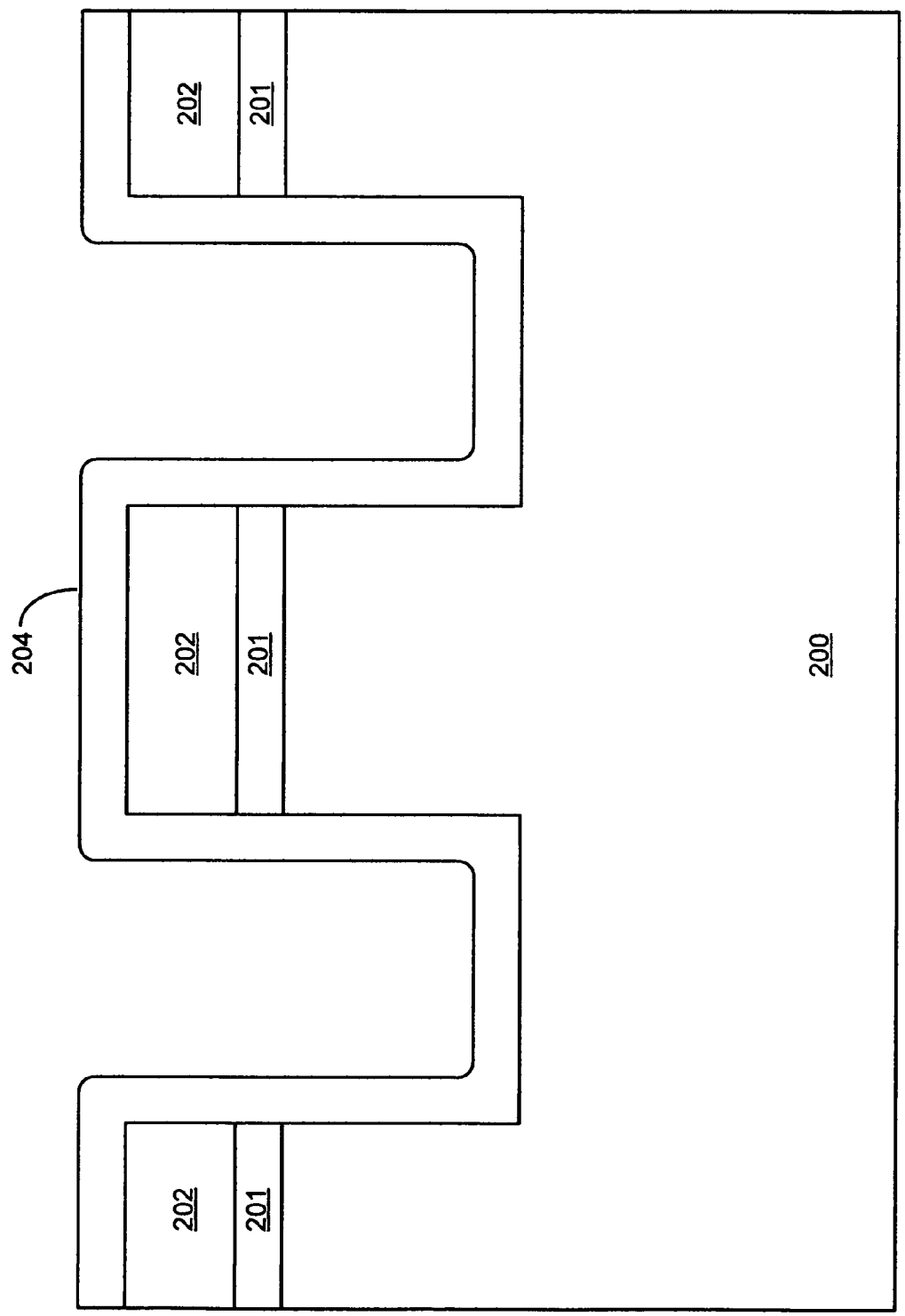
FIG. 2B shows the substrate of FIG. 2A with a second oxide coating in accordance with an embodiment of the present claimed invention.

FIG. 2B shows the substrate of FIG. 2A with a second oxide coating 204 in accordance with an embodiment of the present claimed invention. The second oxide coating may be thermally grown, or may be deposited by CVD or other deposition process. The second oxide coating 204 is preferably between 100 and 3000 angstroms in thickness.

Figure 2C:
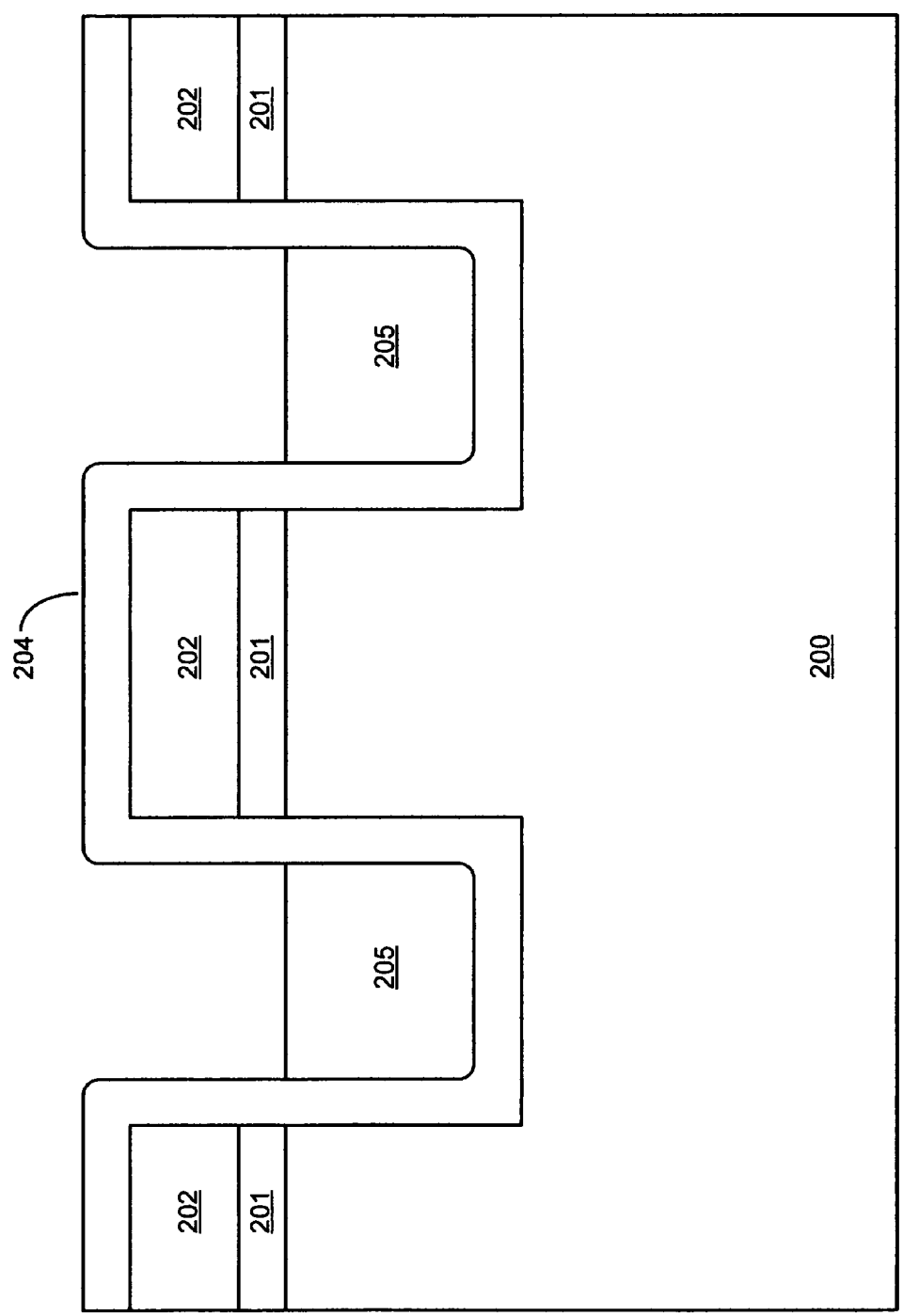
FIG. 2C shows the substrate of FIG. 2B with first polysilicon fills in accordance with an embodiment of the present claimed invention.

FIG. 2C shows the substrate of FIG. 2B with first polysilicon fills 205 in accordance with an embodiment of the present claimed invention. The polysilicon fills 205 are preferably made by depositing a second coating of polysilicon and subsequently etching back the deposited polysilicon so that the surface of the polysilicon remaining in the trenches is nominally at the same level as the surface of the substrate 200.

Figure 2D:
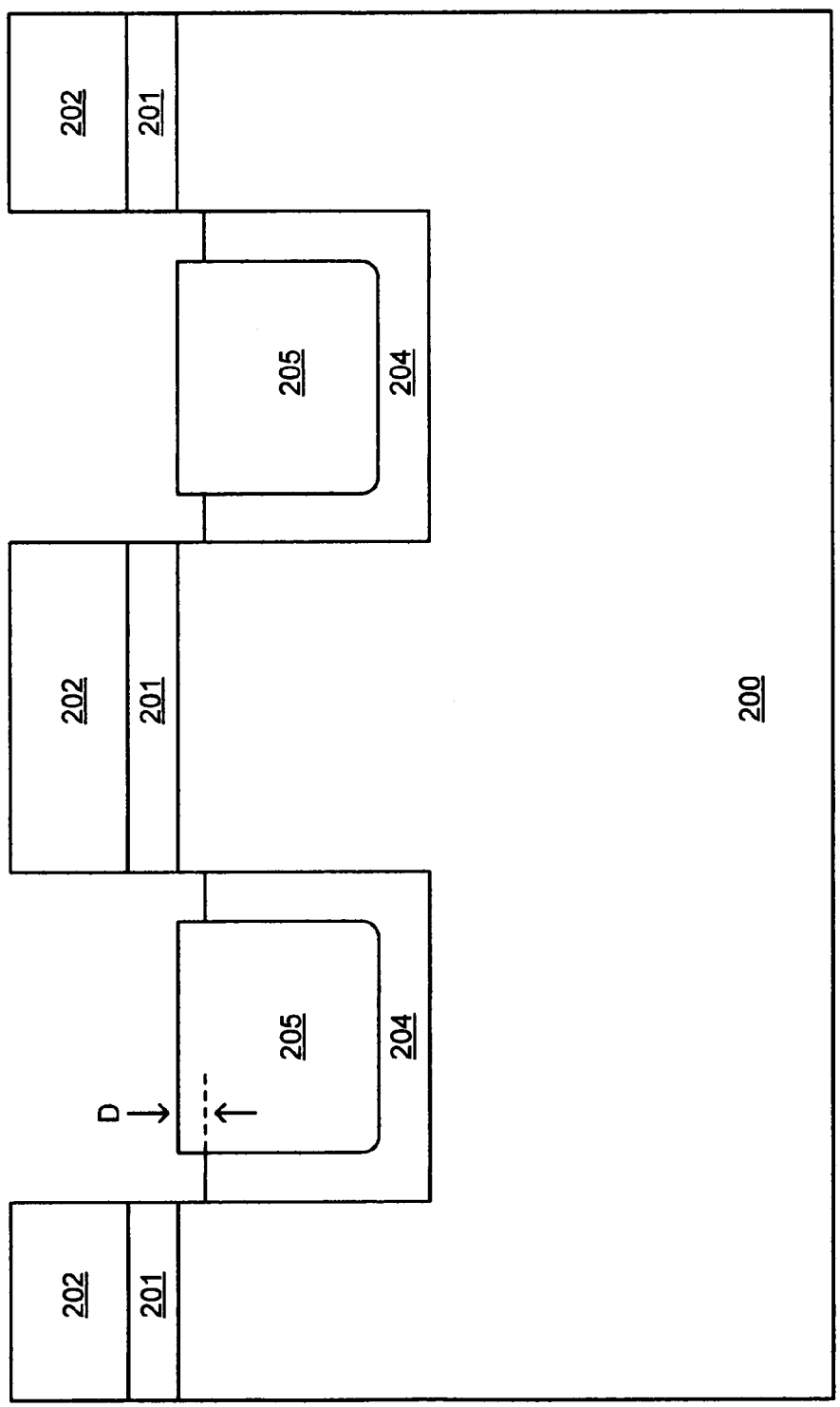
FIG. 2D shows the substrate of FIG. 2C with the second oxide coating etched back to produce a gap between the substrate and the first polysilicon fill in accordance with an embodiment of the present claimed invention.

FIG. 2D shows the substrate of FIG. 2C with the second oxide coating 204 etched back to produce a gap between the substrate 200 and the first polysilicon fill 205 in accordance with an embodiment of the present claimed invention. As shown, the second oxide coating is etched back a distance D below the surface of the substrate 200 and the surface of the first polysilicon fill 205.

Figure 2E:
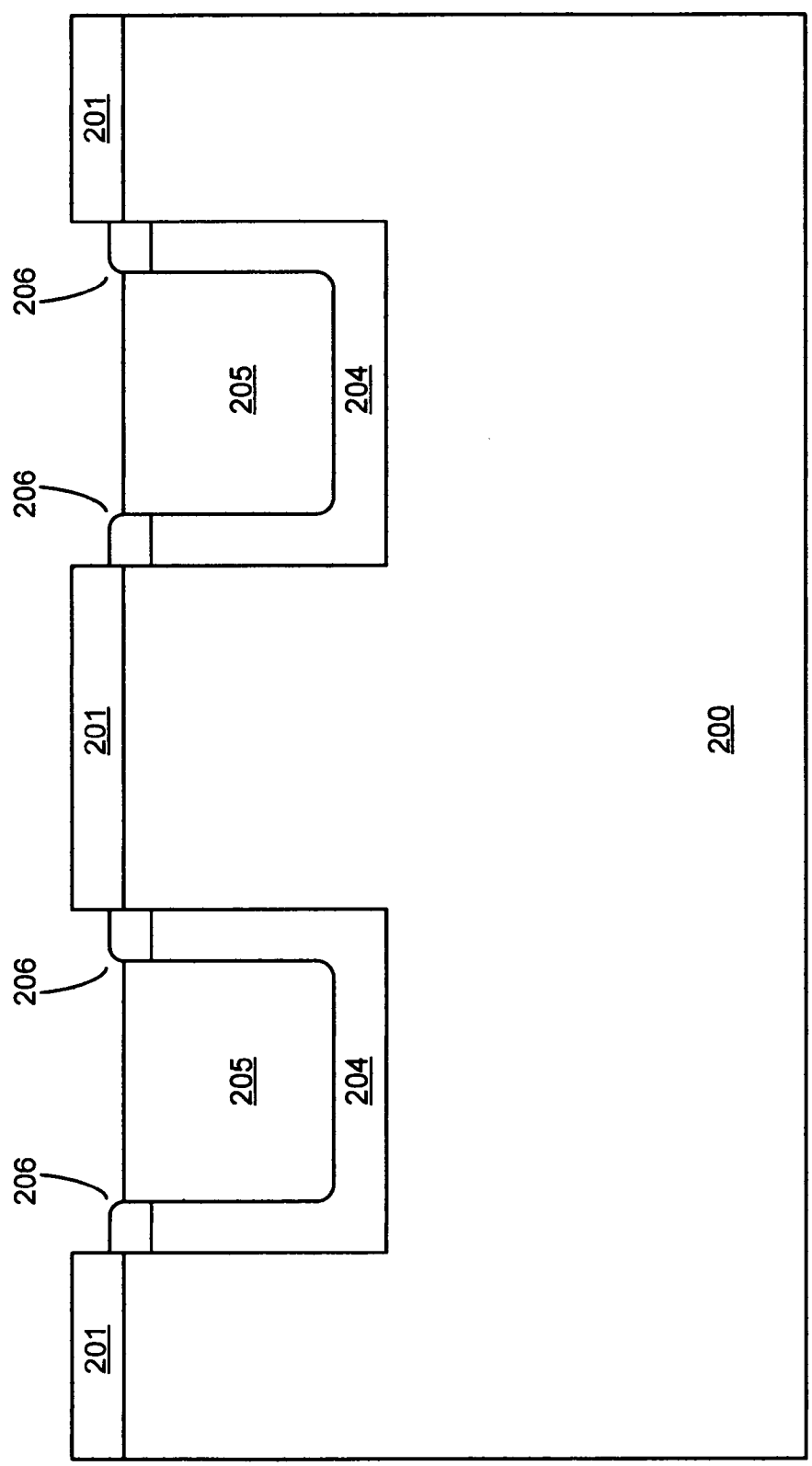
FIG. 2E shows the substrate of FIG. 2D with second polysilicon fills in accordance with an embodiment of the present claimed invention.

FIG. 2E shows the substrate of FIG. 2D with second polysilicon fills 206 in accordance with an embodiment of the present claimed invention. The polysilicon fills 206 are preferably made by depositing a layer of polysilicon in the range of 500 to 5000 angstroms and subsequently etching back the deposited polysilicon (polysilicon 202 is also removed) so that the gap between the substrate 200 and the first polysilicon fill 205 is filled, producing a continuous polysilicon bridge between the first polysilicon fill 205 and the substrate 200. The combination of the first polysilicon fill 205 and the second polysilicon fill 206 provide an etch stop that protects the underlying oxide 204.

Figure 2F:
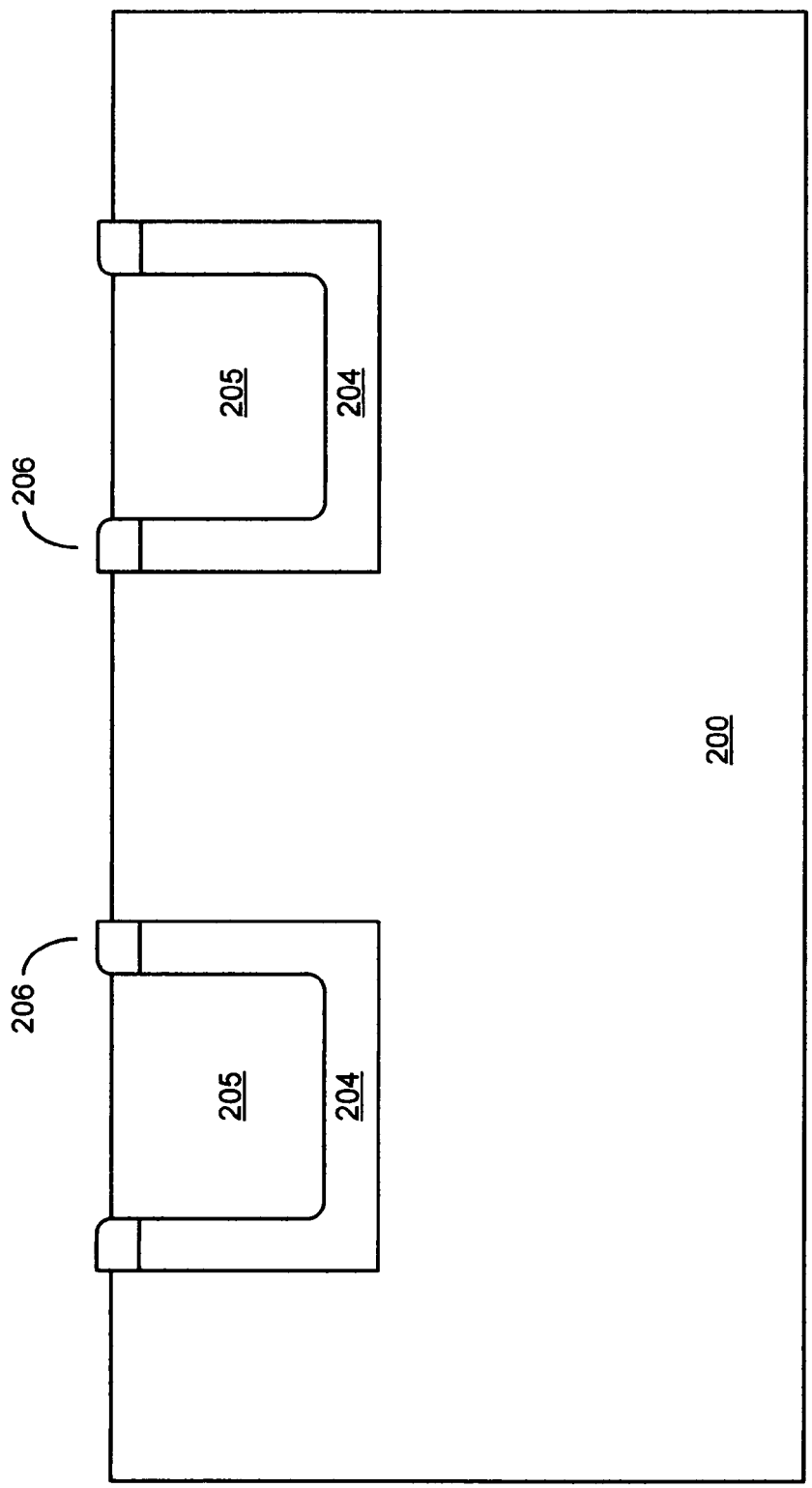
FIG. 2F shows the substrate of FIG. 2E with the oxide layer removed in accordance with an embodiment of the present claimed invention.

FIG. 2F shows the substrate of FIG. 2E with the oxide layer 201 removed, and the surface ready for further processing (e.g., top layer metallization).

In silicon electronic devices, oxide filled trenches are typically used for electrical isolation, and the substitution of a portion of the conventional trench oxide with metallization through process alignment error may lead to increased leakage current or a short circuit.

Figure 3:
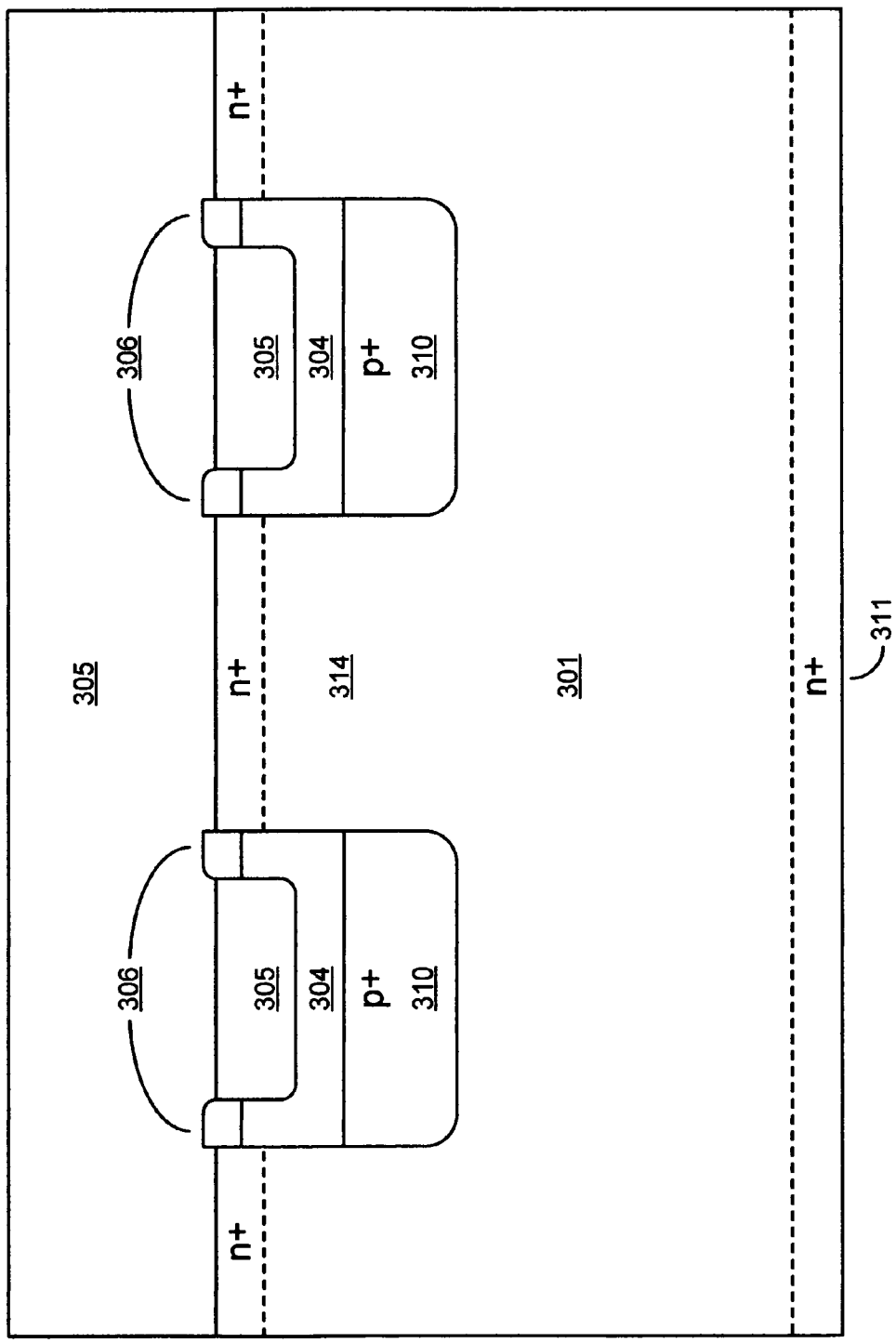
FIG. 3 shows a cross-section of a JFET structure with a composite trench fill in accordance with an embodiment of the present claimed invention.

FIG. 3 shows a cross-section of a JFET structure with a composite trench fill in accordance with an embodiment of the present claimed invention. A planar n-type silicon substrate 300 is shown with $n^+$ contact surfaces on top and bottom for source and drain 311, respectively. Source metallization 305 collects the current that flows through the channel region 314 that is bounded by the gate regions 310.

A composite trench fill comprising an oxide fill 304, a first polysilicon fill 305, and a second polysilicon fill 306 is shown. The composite trench fill provides a continuous polysilicon surface that supports an oxide layer 301. As can be seen in FIG. 3, the etch stop capability of the composite trench fill allows the source contact metallization to be designed for maximum contact area without concern for inadvertent oxide etch, since there is not exposed oxide in the trench fill. For shallow trenches, accurate planarization is more readily achieved when working with a homogeneous surface, as opposed to a heterogeneous polysilicon/oxide surface. In addition, the homogeneous polysilicon surface may be etched (e.g., wet HF or plasma) prior to metallization without damaging exposed oxide dielectric.

Figure 4:
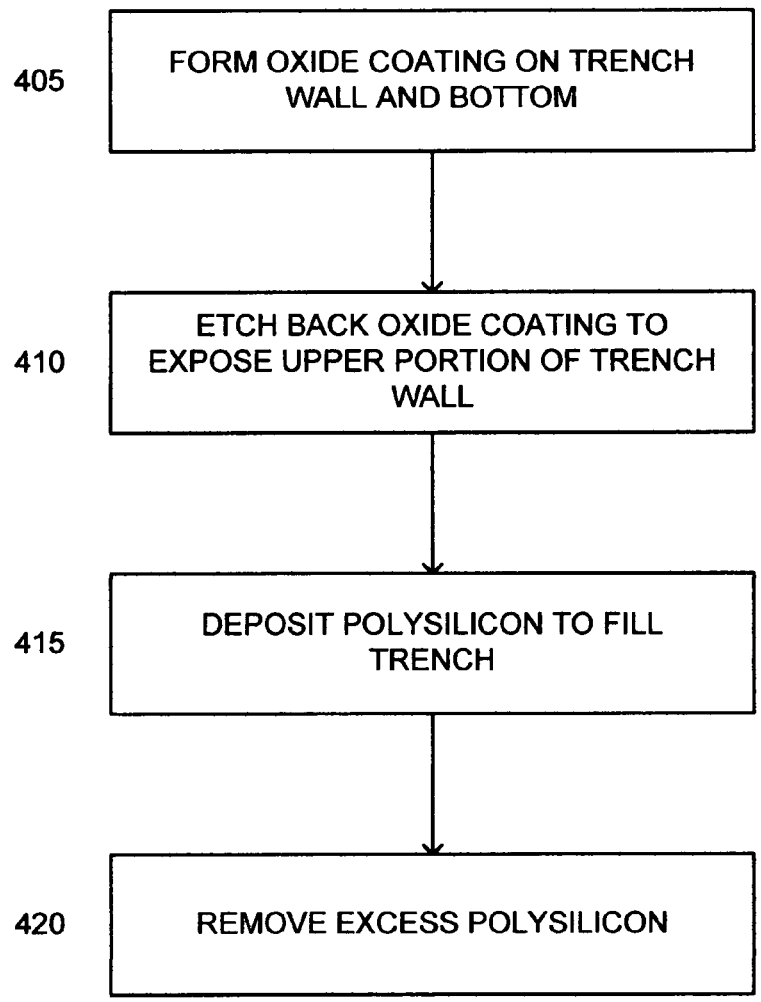
FIG. 4 shows a flow chart for a method embodiment of the present claimed invention.

FIG. 4 shows a flow chart 400 for a method embodiment of the present claimed invention. This fabrication method applies to a trench in a silicon substrate such as that shown in FIG. 2A. In step 405, an oxide coating is formed on the trench wall and bottom, as shown in FIG. 2B. In step 410, the oxide coating is etched back to expose the upper portion of the trench wall. This may be done by low angle ion milling of the substrate under rotation, or other process. In step 415, polysilicon is deposited to completely fill the trench. This typically will involve an overfill. In step 420 the excess polysilicon is removed to level the polysilicon fill with surface of the substrate. This may be done by etching, chemical mechanical polishing (CMP) or other process.

Figure 5:
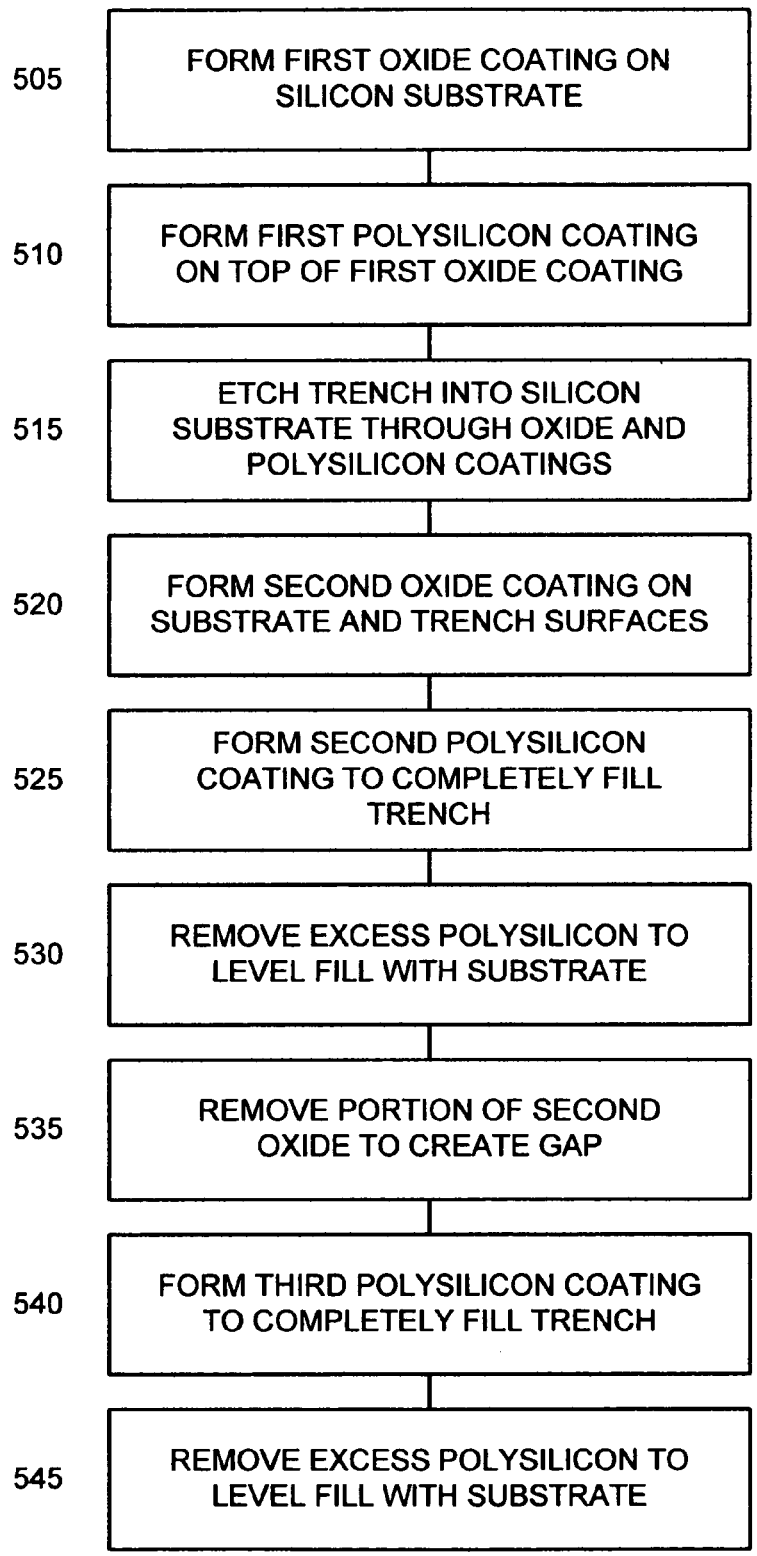
FIG. 5 shows a flow chart for a method embodiment of the present claimed invention using discrete polysilicon depositions.

FIG. 5 shows a flow chart for a method embodiment of the present claimed invention using discrete polysilicon depositions. The method shown FIG. 5 is more involved than the method shown in FIG. 4; however, the more involved method provides better dimension control.

In step 505, a first oxide coating is formed on a silicon substrate. The first oxide coating may be thermally grown, or it may be deposited by chemical vapor deposition (CVD) or other deposition process.

In step 510, a first polysilicon coating is formed on top of the first oxide coating. This coating is preferably formed using CVD.

In step 515, a trench is etched into the silicon substrate through the first oxide coating and the first polysilicon coating. The result of this step is shown in FIG. 2A.

In step 520, a second oxide coating is formed on the surface of the substrate and on the wall and bottom of the trench, as shown in FIG. 2B.

In step 525, a second polysilicon coating is formed on the first oxide coating, filling the remainder of the trench. This step is preferably done by CVD and may involve a degree of overfill.

In step 530, the excess polysilicon from the second polysilicon coating is removed to create a first polysilicon fill that is nominally level with the surface of the substrate as shown in FIG. 2C. This step is preferably done with a reactive ion etch.

In step 535, a portion of the first oxide coating is etched back below the surface of the substrate to create a gap between the silicon substrate and the first polysilicon fill. This etch effectively creates a "moat" around the first polysilicon fill with a depth D as shown in FIG. 2D. Depth D is preferably less than 5000 angstroms.

In step 540, a third polysilicon coating is formed to fill the gap (moat) between the silicon substrate and the first polysilicon fill. This step is preferably done by CVD and may involve a degree of overfill.

In step 545, the excess polysilicon from the third polysilicon coating is removed to create a second polysilicon fill that is nominally level with the surface of the substrate as shown in FIG. 2C. This step is preferably done with a reactive ion etch as shown by the structure of FIG. 2E; however, mechanical polishing or CMP may be used to fully planarize the surface.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. An electronic silicon device comprising:
a silicon substrate comprising a planar surface;
a trench disposed in said planar surface of said silicon substrate, said trench comprising a wall and a bottom;
a silicon dioxide layer disposed on the bottom of said trench and also on a first portion of said wall, said layer being terminated at a distance D below said planar surface of said silicon device;
a polysilicon fill disposed on the surface of said silicon dioxide layer and on a second portion of said wall; and
a metallization disposed on the planar surface of said silicon substrate and an upper surface of said polysilicon fill.

2. The electronic silicon device of claim 1, wherein the upper surface of said polysilicon fill is approximately level with or above said planar surface of said silicon substrate.

3. The electronic silicon device of claim 1, further comprising a junction field effect transistor (JFET).

4. The electronic silicon device of claim 1, further comprising an integrated circuit.

5. The electronic silicon device of claim 1, wherein said trench is disposed above a gate.

6. The electronic silicon device of claim 1, wherein said trench is disposed adjacent to a source.

7. The electronic silicon device of claim 1, wherein said silicon dioxide layer is between 100 angstroms and 3000 angstroms in thickness.

8. The electronic silicon device of claim 1, wherein said silicon dioxide layer is thermally grown.

9. The electronic silicon device of claim 1, wherein said silicon dioxide layer is deposited.

10. A semiconductor device comprising:
a silicon substrate;
a trench disposed in said silicon substrate, said trench comprising a wall and a bottom;
a silicon dioxide layer disposed on the bottom of said trench and also on a first portion of said wall, said layer being terminated below an original surface of said silicon substrate;
a polysilicon fill disposed on the surface of said silicon dioxide layer and on a second portion of said wall; and
a metallization disposed on the original surface of said silicon substrate and an upper surface of said polysilicon fill.

11. The semiconductor device of claim 10, wherein said polysilicon fill comprises an upper surface that is disposed between a top surface of said silicon dioxide layer and said original surface of said silicon substrate.

12. The semiconductor device of claim 10, further comprising a junction field effect transistor (JFET).

13. The semiconductor device of claim 10, further comprising an integrated circuit.

14. The semiconductor device of claim 10, wherein said trench is disposed above a gate structure.

15. The semiconductor device of claim 10, wherein said trench is disposed adjacent to a source structure.

16. The semiconductor device of claim 10, wherein said silicon dioxide layer is between 100 angstroms and 3000 angstroms in thickness.

17. The semiconductor device of claim 10, wherein said silicon dioxide layer is thermally grown.

18. The semiconductor device of claim 10, wherein said silicon dioxide layer is deposited.

19. The electronic silicon device of claim 1, wherein the polysilicon fill disposed on the second portion of said wall is in contact with a doped region of said silicon substrate.

20. The semiconductor device of claim 10, wherein the polysilicon fill disposed on the second portion of said wall is in contact with a doped region of said silicon substrate.

* * * * *